US011869785B2

(12) United States Patent
Miyada et al.

(10) Patent No.: US 11,869,785 B2
(45) Date of Patent: Jan. 9, 2024

(54) METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Tomoyuki Miyada, Toyama (JP); Hajime Abiko, Toyama (JP); Junichi Kawasaki, Toyama (JP); Tadashi Okazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 17/576,549

(22) Filed: Jan. 14, 2022

(65) Prior Publication Data

US 2022/0139745 A1 May 5, 2022

Related U.S. Application Data

(63) Continuation of application No. 16/774,992, filed on Jan. 28, 2020, now Pat. No. 11,257,699, which is a
(Continued)

(51) Int. Cl.
*H01L 21/67* (2006.01)
*C23C 8/10* (2006.01)
(Continued)

(52) U.S. Cl.
CPC .......... *H01L 21/67288* (2013.01); *C23C 8/10* (2013.01); *C23C 16/4587* (2013.01);
(Continued)

(58) Field of Classification Search
CPC ......... H01L 21/67288; H01L 27/67757; H01L 21/67265; H01L 22/12; H01L 21/67259;
(Continued)

(56) References Cited

U.S. PATENT DOCUMENTS 5,565,034 A 10/1996 Nanbu et al.
2005/0035313 A1 2/2005 Garssen et al.
(Continued)

FOREIGN PATENT DOCUMENTS

CN 104899887 A * 9/2015 ........... G06T 7/0004
JP 7-130727 A 5/1995
(Continued)

*Primary Examiner* — Alia Sabur
(74) *Attorney, Agent, or Firm* — Edell, Shapiro & Finnan, LLC

(57) ABSTRACT

Described herein is a technique capable of detecting a substrate state without contacting the substrate. According to one aspect of the technique, there is provided (a) loading a substrate retainer, where a plurality of substrates is placed, into a reaction tube; (b) processing the plurality of the substrates by supplying a gas into the reaction tube; (c) unloading the substrate retainer out of the reaction tube after the plurality of the substrates is processed; and (d) detecting the plurality of the substrates placed on the substrate retainer after the substrate retainer is rotated by a first angle with respect to a transferable position, wherein the plurality of the substrates is transferable to/from the substrate retainer in the transferable position.

22 Claims, 8 Drawing Sheets

Related U.S. Application Data continuation of application No. PCT/JP2017/027474, filed on Jul. 28, 2017.

(51) Int. Cl.
    | | |
    |---|---|
    | *C23C 16/458* | (2006.01) |
    | *H01L 21/673* | (2006.01) |
    | *H01L 21/677* | (2006.01) |
    | *H01L 21/66* | (2006.01) |

(52) U.S. Cl.
    CPC .. *H01L 21/67259* (2013.01); *H01L 21/67303* (2013.01); *H01L 21/67778* (2013.01); *H01L 22/12* (2013.01)

(58) Field of Classification Search
    CPC .. G01N 21/9501; G01N 21/9503–9505; G06T 2207/30148
    See application file for complete search history.

(56) References Cited

U.S. PATENT DOCUMENTS

| | | |
|---|---|---|
| 2005/0213085 A1 | 9/2005 | Lee et al. |
| 2006/0183070 A1 | 8/2006 | Hirano et al. |
| 2009/0114150 A1 | 5/2009 | Yoneda et al. |
| 2009/0122304 A1 | 5/2009 | Jin et al. |
| 2013/0238113 A1* | 9/2013 | Kawasaki ......... H01L 21/67288 700/121 |
| 2015/0300960 A1 | 10/2015 | Morikawa et al. |

FOREIGN PATENT DOCUMENTS

| | | |
|---|---|---|
| JP | 10-135313 A | 5/1998 |
| JP | 2010-153906 A | 7/2010 |
| JP | 2011-18908 A | 1/2011 |
| JP | 2012-146809 A | 8/2012 |
| JP | 5211093 B2 | 6/2013 |
| WO | 2005031851 A1 | 4/2005 |

\* cited by examiner

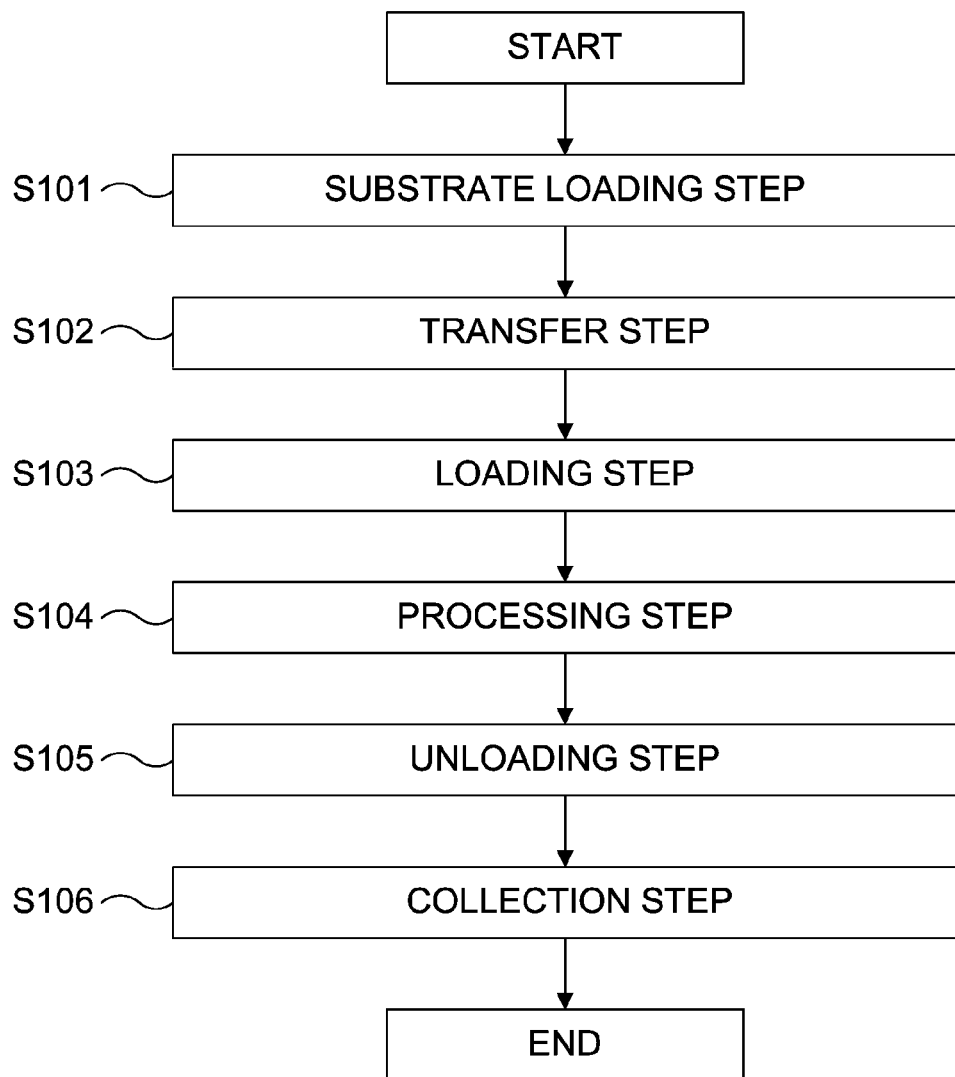

METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This non-provisional U.S. patent application is a continuation of U.S. patent application Ser. No. 16/774,992, filed Jan. 28, 2020, which is a continuation of International Application No. PCT/JP2017/027474, filed on Jul. 28, 2017, the entire contents of which are hereby incorporated by reference.

TECHNICAL FIELD

The present disclosure relates to a method of manufacturing a semiconductor device for processing a substrate and a non-transitory computer-readable recording medium.

BACKGROUND

A substrate (also referred to as a "wafer") may be processed by a substrate processing apparatus (hereinafter, also simply referred to as a "processing apparatus") including a substrate retainer (also referred to as a "boat") configured to accommodate (support) a plurality of substrates including the substrate in multiple stages and a transport device configured to transport (transfer) the plurality of the substrates to the boat. Specifically, the boat is transferred (loaded) into a process furnace of the processing apparatus while the plurality of the substrates is supported by the boat, and the plurality of the substrates is processed in the process furnace. According to the processing apparatus, when a temperature of the substrate is increased (elevated) in the process furnace, or when the substrate is transferred out of the process furnace and cooled, an abnormality (also referred to as an "error") such as cracking and warping of the substrate may occur in the substrate due to the thermal stress. When the cracking or the warping is at a level that the substrate cannot be automatically transferred by an automatic substrate transfer mechanism, a substrate holder (hereinafter also referred to as "tweezers") configured to hold (support) the substrate while the substrate is transferred may collide with the substrate, and the boat may fall by colliding the substrate holder. As a result, serious accidents, such as the damage to components of the processing apparatus (for example, a component made of quartz) may occur.

In order to address the problem described above, a mechanism configured to detect a state of the substrate may be provided. For example, according to related arts, the transport device is provided with a photo sensor. The photo sensor is moved along a vertical axis of the transport device, and the substrate on the substrate holder is detected by the photo sensor.

SUMMARY

Described herein is a technique capable of detecting a state of a substrate without contacting the substrate by a mechanism configured to detect the state of the substrate even when an abnormality occurs in the substrate.

According to one aspect of the technique of the present disclosure, there is provided a method of manufacturing a semiconductor device including: (a) loading a substrate retainer, where a plurality of substrates is placed, into a reaction tube; (b) processing the plurality of the substrates by supplying a gas into the reaction tube; (c) unloading the substrate retainer out of the reaction tube after the plurality of the substrates is processed; and (d) detecting the plurality of the substrates placed on the substrate retainer after the substrate retainer is rotated by a first angle with respect to a transferable position, wherein the plurality of the substrates is transferable to/from the substrate retainer in the transferable position.

BRIEF DESCRIPTION OF THE DRAWINGS

FIG. 10 is a flow chart schematically illustrating an exemplary sequence of a substrate processing according to the embodiments described herein.

DETAILED DESCRIPTION

Embodiments

Hereinafter, one or more embodiments (hereinafter, simply referred to as "embodiments") according to the technique of the present disclosure will be described with reference to the drawings. According to the best mode of the present disclosure, a substrate processing apparatus (hereinafter, also simply referred to as a "processing apparatus") is configured as a vertical type substrate processing apparatus capable of performing a process such as an oxidation process, a diffusion process and a CVD (Chemical Vapor Deposition) process to a substrate. For example, the processing apparatus is used to perform a method of manufacturing a semiconductor device such as an integrated circuit (IC).

Figure 1:
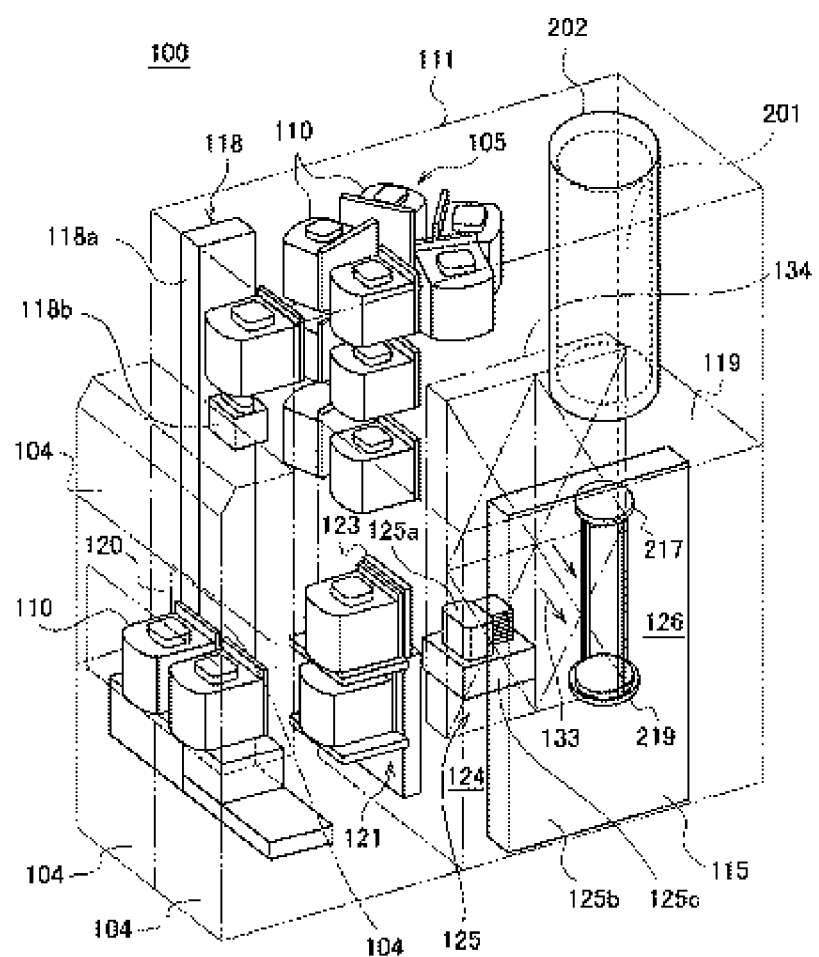
FIG. 1 is a perspective view schematically illustrating a substrate processing apparatus preferably used in one or more embodiments described herein.
Figure 2:
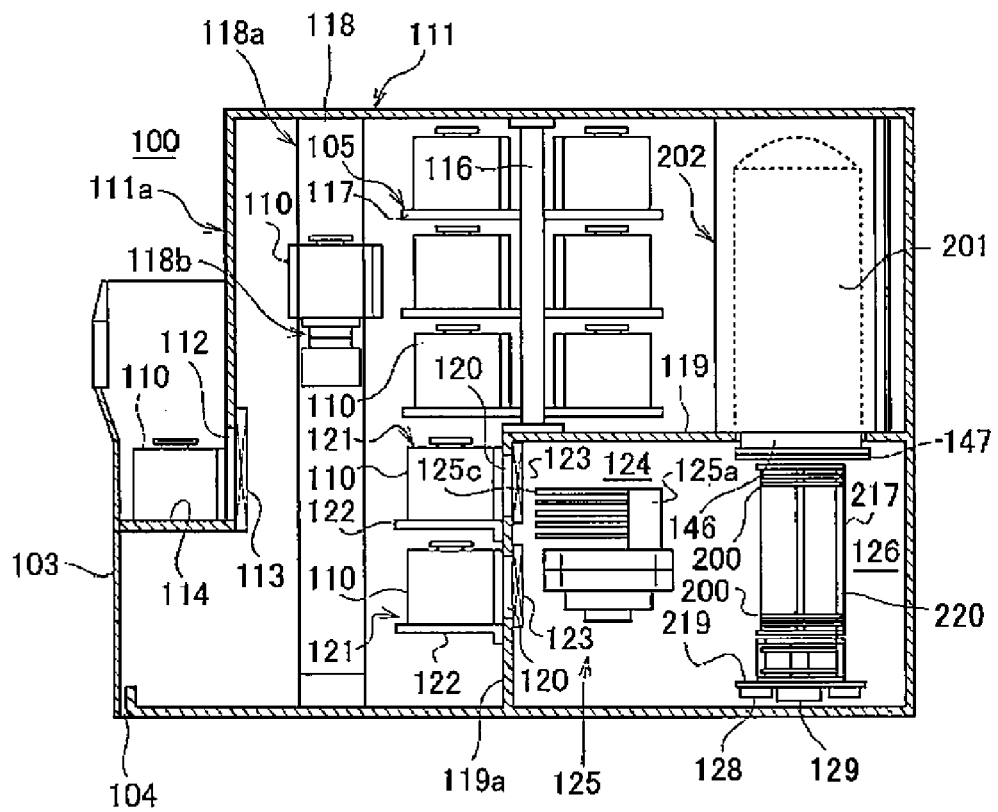
FIG. 2 is another perspective view schematically illustrating the substrate processing apparatus shown in FIG. 1.

As shown in FIGS. 1 and 2, a substrate container (hereinafter, also referred to as a "pod") 110 serving as a carrier configured to accommodate a plurality of substrates including a substrate (also referred to as a "wafer") 200 may be used in a substrate processing apparatus 100. The substrate processing apparatus 100 includes a housing (also referred to as a "pressure-resistant housing") 111. A front maintenance port 103 is provided at a lower front side of a front wall 111a of the housing 111 in order to maintain the substrate processing apparatus 100. A pair of front doors 104 is provided at the front maintenance port 103. The pair of front doors 104 functions as an opening/closing mechanism configured to open or close the front maintenance port 103. A pod loading/unloading port 112 is provided at the front wall 111a of the housing 111 so as to communicate with an inside and an outside of the housing 111. The pod loading/unloading port 112 is opened or closed by a front shutter 113.

A loading port 114 is provided at a front side of the pod loading/unloading port 112. The loading port 114 is configured such that the pod 110 is aligned while placed on the loading port 114. The pod 110 is transferred (loaded) onto the loading port 114 and transferred (unloaded) out of the loading port 114 by an in-process transfer device (not shown).

A rotatable pod shelf 105 is provided over a substantially center portion of the housing 111. The rotatable pod shelf 105 is configured to hold (store) a plurality of pods including the pod 110. The rotatable pod shelf 105 includes a vertical column 116 capable of rotating intermittently along a horizontal direction and a plurality of shelf plates (also referred to as "substrate container placement tables") 117 provided in a radial direction at an upper end portion, a mid portion and a lower end portion of the vertical column 116. Each of the plurality of shelf plates 117 is configured to support a pod such as the pod 110 placed thereon.

A pod transfer device 118 is provided between the loading port 114 and the rotatable pod shelf 105 in the housing 111. The pod transfer device 118 includes: a pod elevator (also referred to as a "pod elevating mechanism") 118a configured to elevate and lower while supporting the pod 110; and a pod transfer mechanism 118b. The pod transfer device 118 transfers the pod 110 among the loading port 114, the rotatable pod shelf 105 and a pod opener 121 by consecutive operations of the pod elevator 118a and the pod transfer mechanism 118b.

A sub-housing 119 is provided below the substantially center portion in the housing 111 toward a rear end of the housing 111. A pair of wafer loading/unloading ports 120 configured to load and unload the wafer 200 serving as the substrate into and out of the sub-housing 119 is provided at a front wall 119a of the sub-housing 119. The pair of wafer loading/unloading ports 120 is arranged vertically in two stages. A pair of pod openers including the pod opener 121 is provided at the pair of the wafer loading/unloading ports 120, respectively. For example, an upper pod opener and a lower pod opener may be provided as the pair of the pod openers. The upper pod opener and the lower pod opener may be collectively or individually referred to as the "pod opener 121". The pod opener 121 includes a placement table 122 where the pod 110 is placed thereon and a cap attaching/detaching mechanism 123 configured to attach or detach a cap of the pod 110. By detaching or attaching the cap of the pod 110 placed on the placement table 122 by the pod opener 121, a wafer entrance of the pod 110 is opened or closed.

The sub-housing 119 defines a transfer chamber 124 fluidically isolated from a space (hereinafter, also referred to as a "pod transfer space") in which the pod transfer device 118 or the rotatable pod shelf 105 is provided. A wafer transport mechanism (also simply referred to as a "transport mechanism") 125 is provided at a front side portion of the transfer chamber 124. The wafer transport mechanism 125 includes a wafer transport device (also simply referred to as a "transport device") 125a and a wafer transport device elevator 125b. The wafer transport device 125a is capable of horizontally rotating or moving the wafer 200. The wafer transport device elevator 125b is capable of elevating or lowering the wafer transport device 125a.

Figure 3:
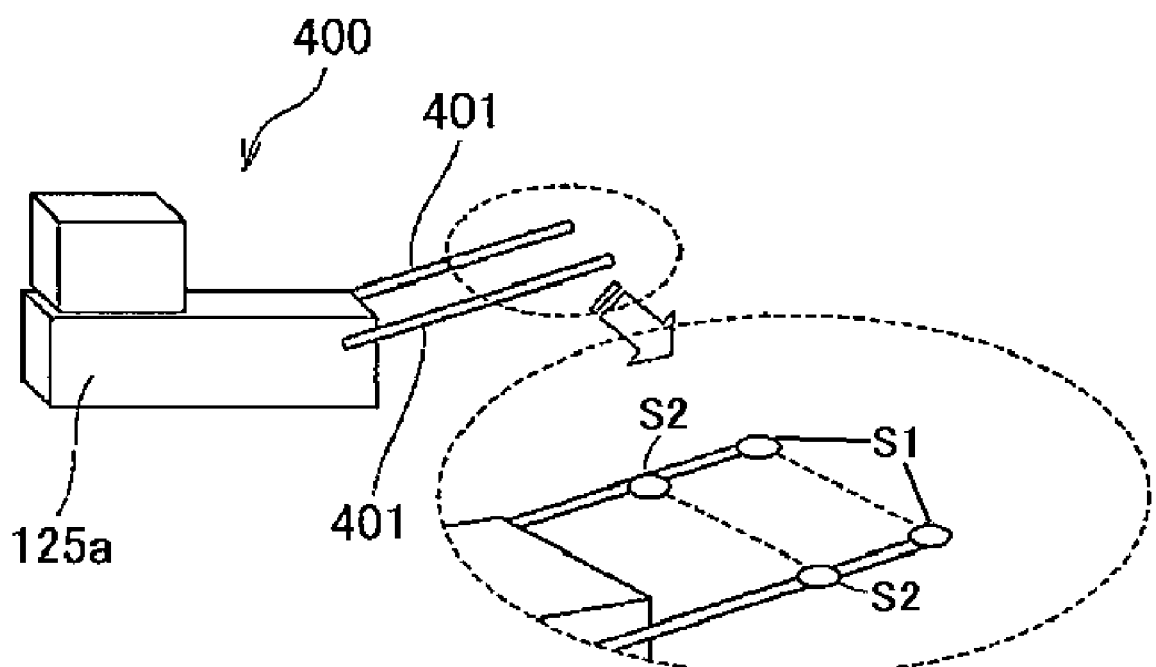
FIG. 3 schematically illustrates a wafer abnormality detection device as an example of transport information detection mechanism preferably used in the embodiments described herein.

As shown in FIG. 3, a wafer abnormality detection device (hereinafter, also simply referred to as a "wafer detection device") 400 configured to detect a transport state of the wafer 200 is attached to the wafer transport device 125a. For example, as shown in FIG. 3, the wafer abnormality detection device 400 is constituted by a pair of detection arms 401 rotatably attached to both sides of the wafer transport device 125a and an actuator (not shown) configured to drive (rotate) the pair of the detection arms 401. Each of the detection arms 401 is provided with a wafer position detection sensor S1 (hereinafter, also simply referred to as a "sensor S1") and a wafer jump-out detection sensor S2 (hereinafter, also simply referred to as a "sensor S2"). As described above, even when the wafer 200 jumps out (that is, when a wafer jump-out occurs), it is possible to detect the wafer jump-out of the wafer 200 by the sensor S2. In FIG. 3, the illustration of a boat 217 is omitted.

As schematically shown in FIG. 1, the wafer transport device elevator 125b is provided between a right end of the front portion of the transfer chamber 124 of the sub-housing 119 and a right side end of the pressure-resistant housing 111. The wafer transport device 125a is further includes tweezers (also referred to as a "substrate holder") 125c capable of supporting the wafer 200. Using the tweezers 125c to place the wafer 200 thereon, the wafer transport mechanism 125 is configured to charge or discharge the wafer 200 into or out of the boat (also referred to as a "substrate retainer") 217 serving as a placement port of the wafer 200 by consecutive operations of the wafer transport device elevator 125b and the wafer transport device 125a.

A standby space 126 where the boat 217 is accommodated in standby state is provided at a rear side portion of the transfer chamber 214. A process furnace 202 is provided above the standby space 126. A lower end of the process furnace 202 may be opened or closed by a furnace opening shutter (also referred to as a "furnace opening opening/closing mechanism") 147. A boat elevator 115 is provided between a right end of the standby space 126 of the sub-housing 119 and the right side end of the pressure-resistant housing 111. The boat elevator 115 is configured to elevate or lower the boat 217. An arm 128 serving as a coupling component is connected to an elevating table (not shown) of the boat elevator 115. A seal cap 219 is provided horizontally at the arm 128. A boat rotating mechanism 129 configured to rotate the boat 217 is provided at the seal cap 219.

The seal cap 219 is configured to support the boat 217 vertically and configured to close the lower end of the process furnace 202. The boat 217 includes a plurality of support columns 220 serving as a plurality of supporting components provided with slots (grooves). The slots of the plurality of the support columns 220 are configured to support the plurality of the wafers including the wafer 200 in multiple stages. The boat 217 is configured to support the plurality of the wafers (for example, 50 wafers to 200 wafers) while each of the plurality of the wafers is horizontally oriented and concentrically arranged in the vertical direction by the slots of the plurality of the support columns 220.

A clean air supply mechanism 134 is provided at a left end of a left side portion of the transfer chamber 124 opposite to the boat elevator 115 and the wafer transport device elevator 125b. The clean air supply mechanism 134 is configured to supply clean air 133 such as an inert gas and a clean atmosphere. The clean air supply mechanism 134 includes a supply fan (not shown) and a dust-proof filter (not shown). A notch alignment device (not shown) serving as a substrate alignment device configured to align a circumferential position of the wafer 200 is installed between the wafer transport device 125a and the clean air supply mechanism 134.

The clean air 133 ejected from the clean air supply mechanism 134 flows around the notch alignment device, the wafer transport device 125a and the boat 217 accommodated in the standby space 126. Thereafter, the clean air 133 is exhausted from the housing 111 through a duct (not shown), or the clean air 133 is circulated back to a primary side (supply side) of the clean air supply mechanism 134 and then ejected again into the transfer chamber 124 by the clean air supply mechanism 134.

Hereinafter, the operation of the substrate processing apparatus 100 preferably used in the embodiments will be described with reference to FIGS. 1 and 2. When the pod 110 is placed on the loading port 114, the pod loading/unloading port 112 is opened by the front shutter 113. The pod 110 placed on the loading port 114 is loaded (transferred) into the housing 111 through the pod loading/unloading port 112 by the pod transfer device 118.

The pod 110 loaded into the housing 111 is automatically transferred to and temporarily stored in a designated shelf plate among the plurality of shelf plates 117 of the rotatable pod shelf 105 by the pod transfer device 118. Thereafter, the pod 110 is transferred to the placement table 122 from the designated shelf plate. Alternatively, the pod 110 may be transferred directly to the placement table 122 from the loading port 114.

When the wafer entrance of the pod 110 placed on the placement table 122 is pressed against the wafer loading/unloading port 120 of the front wall 119a of the sub-housing 119, the cap attaching/detaching mechanism 123 detaches the cap of the pod 110 and the wafer entrance of the pod 110 is opened. Thereafter, the wafer 200 is transported out of the pod 110 by the tweezers 125c of the wafer transport device 125a via the wafer entrance, and aligned by the notch alignment device (not shown). The wafer 200 aligned by the notch alignment device is then loaded into the standby space 126 provided behind the transfer chamber 124, and is loaded (charged) into the boat 217. After charging the wafer 200 into the boat 217, the wafer transport device 125a then returns to the pod 110 and transports a next wafer of the plurality of the wafers from the pod 110 into the boat 217.

While the wafer transport mechanism 125 loads the plurality of the wafers including the wafer 200 from the placement table 122 of one of the upper and lower pod openers into the boat 217, another pod of the plurality of the pods is transferred to and placed on the placement table 122 of the other of the upper and lower pod openers from the rotatable pod shelf 105 by the pod transfer device 118, and the cap of the above-mentioned another pod is opened by the other of the upper and lower pod openers.

Figure 6:
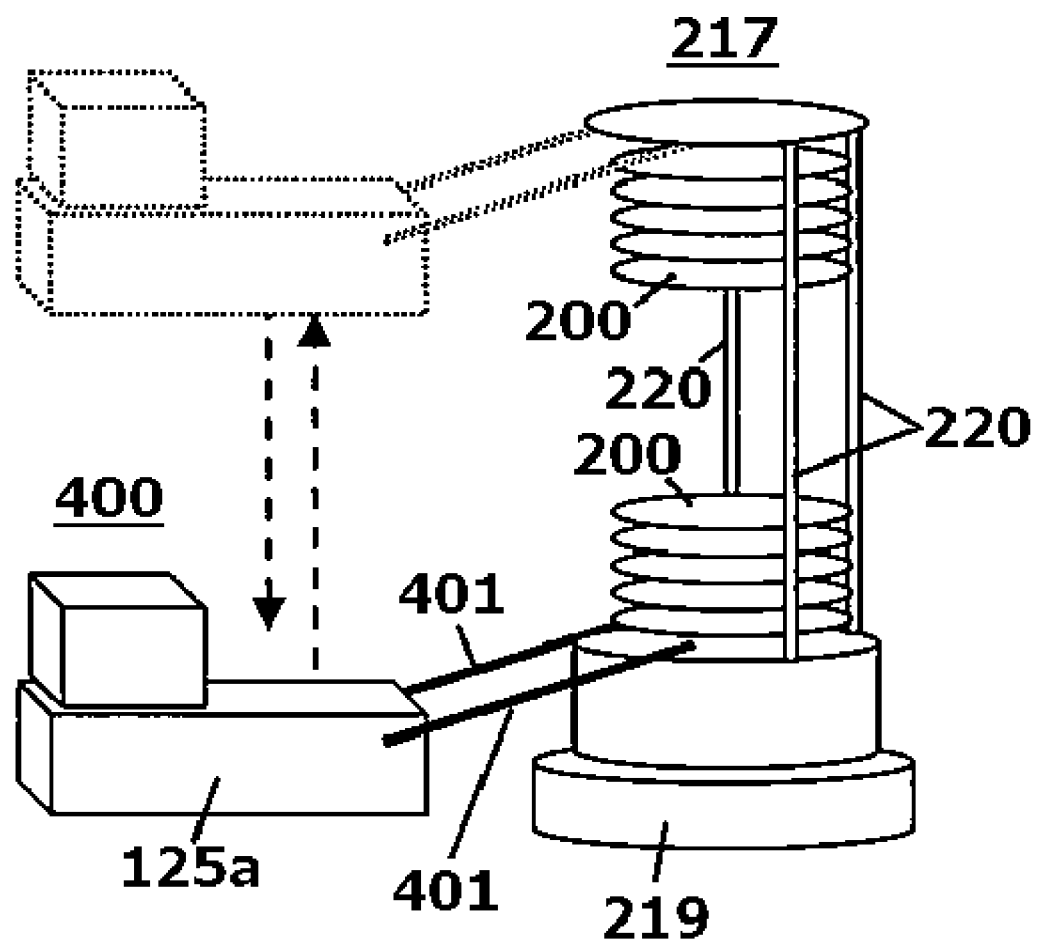
FIG. 6 schematically illustrates an example of a wafer detection operation using the wafer abnormality detection device shown in FIG. 3.

After the plurality of the wafers including the wafer 200 is completely loaded (charged) into the boat 217, transport information is detected by the wafer abnormality detection device 400. In order to detect the transport information, as shown in FIG. 3, the wafer abnormality detection device 400 includes a configuration in which the pair of the detection arms (for example, two detection arms) 401 is provided at the wafer transport device 125a. As shown in FIG. 6, for example, the pair of the detection arms 401 is inserted below the wafer 200 placed on the boat 217, and is arranged such that the wafer 200 is supported by the pair of the detection arms 401. Thereafter, the wafer transport device 125a is sequentially moved upward and downward to a plurality of wafer crack detection points at lower surfaces of the plurality of the wafers in order to detect the transport information of the plurality of the wafers.

Thereby, for example, the presence or absence of the wafer 200 is detected by a light shielding of the sensor S1, and the wafer jump-out of the wafer 200 is detected by a light shielding of the sensor S2. In addition, Further, whether or not the boat slot position is appropriate is detected based on a threshold level of the light shielding, and the crack of the plurality of the wafers including the wafer 200 is detected (obtained) by comparing a displacement amount (deflection) of each of the plurality of the wafer crack detection points, or obtained from a relationship between the displacement amount and an allowable stress at each of the plurality of the wafer crack detection points. In FIG. 6, the illustration of the tweezers 125c is omitted.

When the boat 217 is inserted (loaded) into the process furnace 202, the lower end of the process furnace 202 is opened by the furnace opening shutter 147. Then, by elevating the seal cap 219 by the boat elevator 115, the boat 217 is inserted (loaded) into the process furnace 202. As a result, the plurality of the wafers including the wafer 200 accommodated in the boat 217 is loaded into the process furnace 202.

After the plurality of the wafers including the wafer 200 is loaded into the process furnace 202, the wafer 200 is processed in the process furnace 202. For example, a process such as an oxidation process, a film-forming process and a diffusion process is performed to the wafer 200. After the wafer 200 is processed, the boat 217 is unloaded out of the process furnace 202 in an order reverse to that described above except for an aligning step of the wafer 200 by the notch alignment device (not shown) and a wafer abnormality detection step performed after the boat 217 is unloaded. Then, the pod 110 accommodating processed wafers including the wafer 200 is transported out of the substrate processing apparatus 100, that is, out of the housing 111.

In the wafer abnormality detection step performed after the boat 217 is unloaded, as described later, before the processed wafers including the wafer 200 are transported out of the boat 217, a wafer abnormality (for example, a wafer crack) is detected. For example, when the wafer crack is detected, a wafer with the crack (hereinafter, referred to as an "abnormal wafer") whose transport state is abnormal and other wafers close to the abnormal wafer are loaded to a transfer container different from the pod 110 by the wafer transport device 125a. Thereafter, a normal wafer without the crack is discharged (collected) from the boat 217.

While the embodiments are described by way of an example in which the wafer abnormality detection step is performed after the boat 217 is unloaded, the embodiments are not limited thereto. For example, the wafer abnormality detection step may be performed after the plurality of the wafers including the wafer 200 is loaded into the boat 217 and before the wafer 200 is processed. When the wafer abnormality detection step is performed before the wafer 200 is processed, it is possible to detect the wafer crack of the plurality of the wafers including the wafer 200 before the plurality of the wafers is loaded into the process furnace 202. As a result, it is possible to prevent an accidental loss caused by the wafer crack such as a lot-out. In addition, the wafer abnormality detection step may be performed both after the plurality of the wafers including the wafer 200 is loaded into the boat 217 and before the processed wafers including the wafer 200 are transferred out of the boat 217 after performing a process such as a heat treatment process to the wafer 200. When the wafer abnormality detection step is performed both after the wafer 200 is loaded into the boat 217 and before the wafer 200 is transferred out of the boat 217, it is possible to detect the wafer crack under the optimum conditions by obtaining reference data before the heat treatment process and by performing the wafer abnormality detection step after the heat treatment process.

Figure 4:
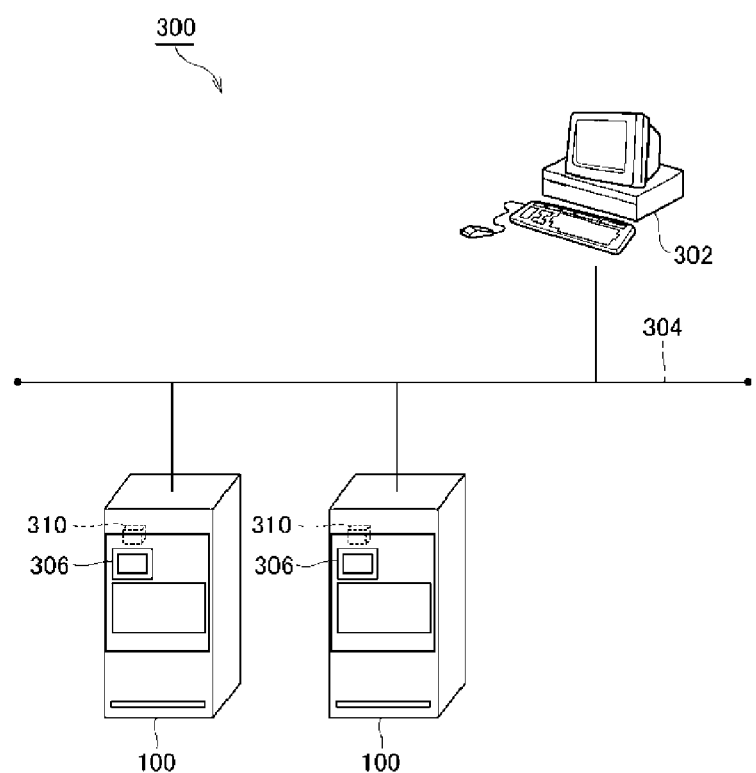
FIG. 4 schematically illustrates an example of a controller of a substrate processing system configured to control a plurality of substrate processing apparatuses preferably used in the embodiments described herein.

As shown in FIG. 4, a substrate processing system 300 is provided with a computer 302 configured to manage a plurality of substrate processing apparatuses including the substrate processing apparatus 100 or configured to analyze data. Each of the plurality of the substrate processing apparatuses is provided with a process module controller (hereinafter, also simply referred to as a "PMC") 310. The PMC 310 is connected to the computer 302 via a communication line 304 such as a LAN for communication. In general, the computer 302 performs operation managements of the plurality of the substrate processing apparatuses, or the computer 302 is used to analyze the data transmitted from the plurality of the substrate processing apparatuses. In general, the computer 302 is installed outside a clean room where the plurality of the substrate processing apparatuses is provided.

Figure 5:
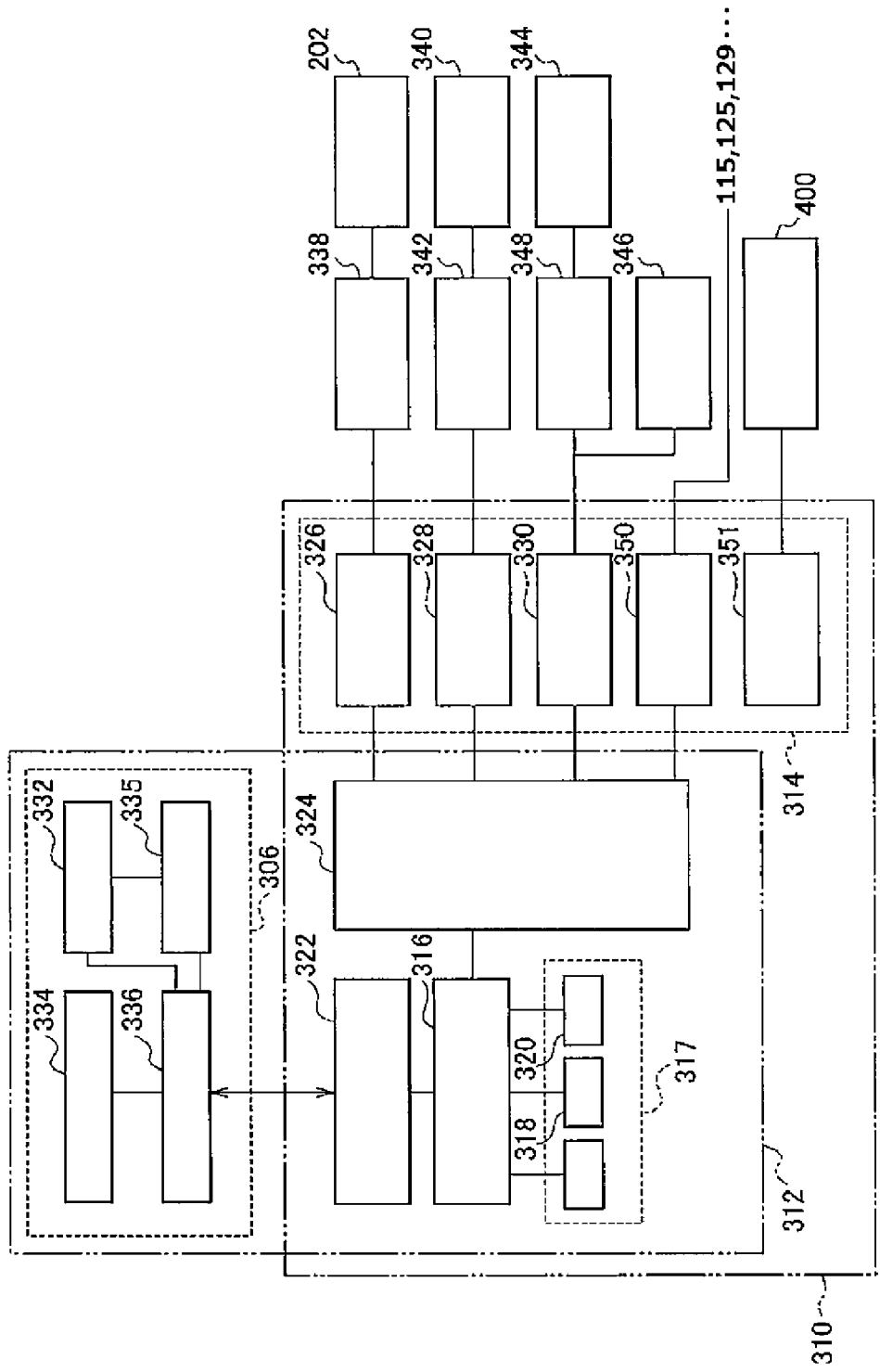
FIG. 5 is a block diagram schematically illustrating a configuration of the controller and related components of the substrate processing system preferably used in the embodiments described herein.

As shown in FIG. 5, the PMC 310 may be constituted by a main controller 312 and a sub controller 314. The main controller 312 may be constituted by: an input/output device 306; a CPU (Central Processing Unit) 316; a memory device 317 serving as a storage device; a transmission/reception processor 322 configured to transmit or receive data to or from the computer 302; and an I/O controller 324 configured to perform an I/O (input/output) control between the CPU 316 and the sub controller 314. A configuration of the computer 302 may be substantially the same as that of the main controller 312.

For example, the sub controller 314 may be constituted by: a temperature controller 326 configured to control (adjust) an inner temperature of the process chamber 201 to a substrate processing temperature by a heater (not shown) provided on an outer periphery of the process furnace 202; a gas controller 328 configured to control an amount such as an amount of a reactive gas supplied into the process furnace 202 based on the output value (detected value) from a mass flow controller (MFC) 342 provided at a gas pipe 340 of the process furnace 202; a pressure controller 330 configured to control an inner pressure of the process chamber 201 of the process furnace 202 to a substrate processing pressure by opening or closing a valve 348 or by controlling an opening degree of the valve 348 based on the output value (detected value) of a pressure sensor 346 provided at an exhaust pipe 344 of the process furnace 202; a transfer controller 350 configured to control an actuator of a substrate transfer system; and an abnormality determination part 351 configured to determine the transport state of the plurality of the wafers including the wafer 200 based on the detected value of the wafer abnormality detection device 400. For example, the abnormality determination part 351 may be incorporated in the transport controller 350.

For example, the memory device 317 may be constituted by components such as a ROM (Read Only Memory) 318, a RAM (Random Access Memory) 320 and a hard disk (Hard Disk). For example, a recipe, various programs and reference data is stored in the memory device 317. According to the embodiments, master data (described later) measured in advance is stored in the memory device 317. Information for each of the plurality of the wafers including the wafer 200 (for example, wafer individual information, wafer type information, wafer transport information and wafer transport state correction information) is stored in the memory device 317 as the reference data. The wafer individual information described above refers to data obtained by editing a plurality of information as a set. For example, the plurality of the information of the wafer 200 may include: a lot ID indicating a lot number of the wafer 200; a pod slot number indicating a slot insertion position of the pod 110; a boat slot number indicating a slot of the boat 217 designated by the boat 217 for inserting the wafer 200; and a type of the wafer 200. In addition, the wafer type information of the wafer 200 refers to information indicating the type of the wafer 200, specifically, information indicating the type of wafer 200 such as a production wafer, a monitor wafer, a side dummy wafer and a supplementary dummy wafer. The wafer transport information of the wafer 200 refers to information indicating the transport state of the wafer 200 on the boat 217 obtained from the wafer individual information of each of the plurality of the wafers including the wafer 200. In addition, the wafer transport information of the wafer 200 includes information on a determination result obtained by the abnormality determination part 351 by comparing the detected data obtained by the sensor S1 provided on the pair of the detection arms 401 with the master data measured in advance. For example, the information (that is, the abnormality information of the wafer 200) is roughly divided into a normal transport state or an abnormal transport state of the wafer 200. When the transport state is abnormal, the abnormality information of the wafer 200 may indicate the abnormal transport state such as a state in which an insertion depth of the wafer 200 inserted in the slot of the boat 217 is shallow and the wafer 200 jumps out from the boat 217 (hereinafter, also referred to as the "wafer jump-out"), a state in which the wafer 200 is cracked (hereinafter, also referred to as the wafer crack), a state in which the wafer 200 is inserted into a slot of another boat instead of the slot of the designated boat 217 (hereinafter, also referred to as a "slot difference") and a state in which the wafer 200 is placed on the wafer transport device 125a such that the slot of the designated boat 217 is left empty (hereinafter, also referred to as an "empty slot"). When the transport state is normal, the abnormality information of the wafer 200 may indicate the normal transport state such as a state of "no abnormality". In addition, the wafer transport state correction information of the wafer 200 refers to information obtained by correcting the transport information of the wafer 200 when the wafer 200 is in the abnormal transport state. Such correction is necessary in order to combine the data on a hardware side of the substrate processing apparatus 100 and the data on a controller side of the substrate processing system 300 after the transport state of the wafer 200 is recovered by the maintenance.

For example, the input/output device 306 may include: a display device 334 configured to display information such as the data stored in the memory device 317; an input device 332 configured to receive an input data such as an input instruction of an operator (that is, a user) from an operation screen of the display device 334; a temporary memory device 335 configured to temporarily store the input data received by the input device 332 until the input data is transmitted to the transmission/reception processor 322 by a display controller 336 described later; and the display controller 336 configured to receive the input data such as the input instruction through the input device 332 and to transmit the input data to the display device 334 or the transmission/reception processor 322.

For example, the display controller 336 is configured to receive an instruction such as an execution instruction for executing an arbitrary recipe among a plurality of recipes stored in the memory device 317 by the CPU 316 via the transmission/reception processor 322. The display device 334 is configured to display various display screens required for a substrate processing on the operation screen of the display device 334. For example, screens for selecting, editing and executing a recipe, a screen for executing a command; a screen for executing a recovery and a screen for monitoring an operation status of the substrate processing apparatus 100 may be displayed on the operation screen by the display device 334.

When a recipe created or edited by the input/output device 306 is executed on the operation screen, the sub controller 314 may refer to the setting value of the recipe sequentially in the order of the steps in the recipe. By feedback controlling the substrate transfer system of the substrate processing apparatus 100 and the actuator of the substrate transfer system, the substrate processing such as the oxidation process, the diffusion process and the film-forming process is performed to the wafer 200.

When transporting the wafer 200 to the boat 217 or transporting the wafer 200 from the boat 217 to the pod 110, the transfer controller 350 is configured to refer to the wafer individual information (wafer ID) stored in advance in the memory device 317 and configured to control transfer systems (substrate transfer systems) of the wafer transport device 125a or the boat elevator 115 in order to transfer the wafer 200. In addition, when the boat 217 is loaded into the process furnace 202, the transfer controller 350 is configured to control the boat rotating mechanism 129 so as to rotate the boat 217 at a predetermined speed according to the recipe being executed.

After the plurality of the wafers including the wafer 200 is processed by executing the recipe and before the boat 217 is unloaded out of the process furnace 202, or before the boat 217 with the plurality of the wafers including the wafer 200 is loaded into the process furnace 202, the abnormality determination part 351 is configured to determine the transport state of each of the wafers based on the result detected for each of the plurality of the wafers including the wafer 200 by the wafer abnormality detection device 400.

As shown in FIG. 6, according to the embodiments, for example, the wafer 200 is detected by arranging the wafer 200 such that the wafer 200 is supported by the pair of the detection arms 401. Thereby, it is possible to confirm whether there is no abnormality such as the tilt, the crack, the jump-out and the double stacking on the boat 217 and a predetermined number of wafers is placed at predetermined positions (grooves). However, as shown in FIG. 7, when the wafer 200 jumps out, the wafer 200 may collide with or come into contact with the pair of the detection arms 401 or the wafer transport device 125a, which may increase the damage.

Figure 7:
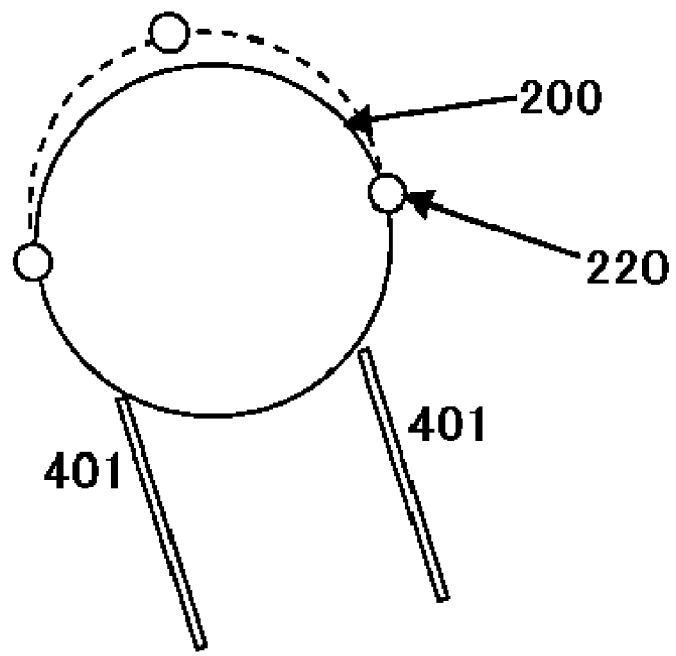
FIG. 7 schematically illustrates the example of the wafer detection operation using the wafer abnormality detection device shown in FIG. 6 when viewed from above.

As shown in FIG. 7, the boat 217 includes the plurality of the support columns 220 (for example, three or four support columns), and the wafer 200 is detected while the wafer transport device 125a in a transferable position relative to the boat 217 (that is, the position for the transport to be performed) where the wafer transport device 125a can transport the plurality of the wafer including the wafer 200 to/from the boat 217. Since the plurality of the support columns 220 is provided, when the wafer 200 jumps out, the wafer 200 jumps out toward the wafer transport device 125a. When the wafer 200 jumps out to a certain extent, the wafer 200 may be accommodated in the pair of the detection arms 401, and it is possible to detect the jump-out of the wafer 200 by the sensor S2.

Figure 8A:
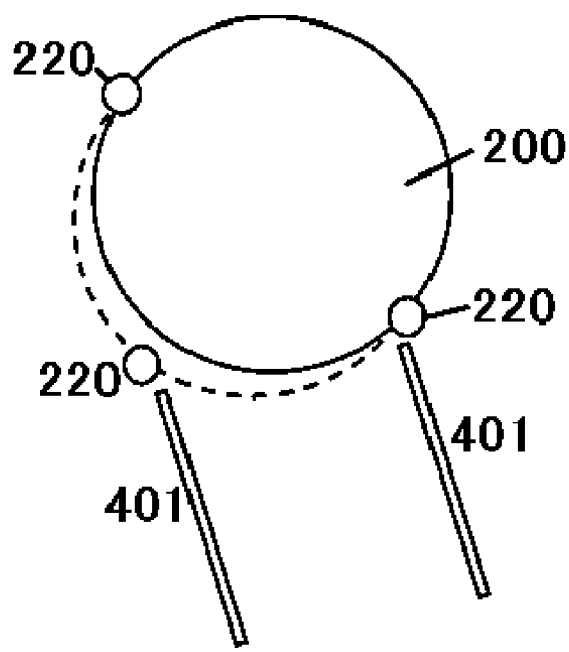
FIG. 8A schematically illustrates another example of the wafer detection operation using the wafer abnormality detection device preferably used in the embodiments described herein when viewed from above.
Figure 8B:
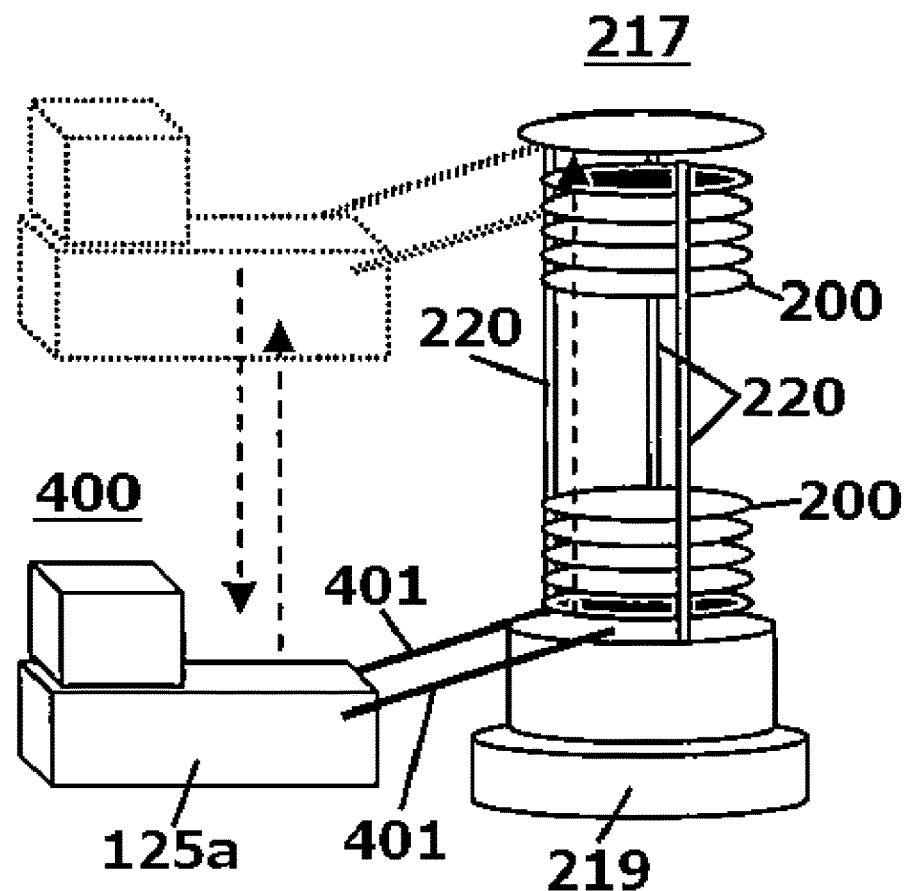
FIG. 8B schematically illustrates another example of the wafer detection operation using the wafer abnormality detection device preferably used in the embodiments described herein.

However, when a jumping-out wafer 200 collides with the pair of the detection arms 401, other wafers of the plurality of the wafers may be affected, and the damage may be increased. According to the embodiments, as shown in FIG. 8A, the boat 217 is rotated by a predetermined angle and the plurality of the wafers including the wafer 200 is detected by the pair of the detection arms 401. Specifically, since the location where the wafer 200 jumps out can be detected as "no wafer" by the sensor S1 provided on the pair of the detection arms 401, it is possible to confirm the abnormality as well as the crack of each of the wafers. In addition, it is necessary to operate the boat rotating mechanism 129 and to acquire crack detection position data serving as the master data in advance so that the sensor S1 can detect the presence of each of the wafers including the wafer 200. As shown in FIG. 8B, similar to FIG. 6, it is possible to confirm whether there is no abnormality (such as the tilt, the crack, the jump-out and the double stacking) and the predetermined number of wafers is placed at the predetermined position (groove). Thereby, it is possible to detect the crack of each of the wafers regardless of the wafer jump-out.

As described above, according to the embodiments, the boat 217 is rotated by the predetermined angle using the boat rotating mechanism 129 and a crack detection is performed by the wafer detection device 400 between the support columns 220 of the boat 217 at a location where the sensor S1 can avoid colliding with the plurality of the wafers including the wafer 200 or the plurality of the support columns 220 (that is, the position where each of the wafers including the wafer 200 can be detected by the sensor S1). Thereby, it is possible to perform the detection of each of the wafers without contacting each of the wafers even when the wafer 200 jumps out. For example, the boat 217 may be rotated by the predetermined angle so that the wafer transport device 125a is positioned at a center between the plurality of the support columns 220 with respect to the boat 217.

First Embodiment

Hereinafter, a first embodiment in which the substrate processing serving as one of manufacturing processes of the semiconductor device is performed using the substrate processing apparatus 100 preferably used in the embodiments will be described. According to the first embodiment, the detection operation (wafer detection operation) by the pair of the detection arms 401 of the wafer abnormality detection device 400 is executed after the boat 217 is unloaded out of the process furnace 202. In addition, the main controller 312 is configured to perform (execute) an exemplary sequence of the substrate processing shown in FIG. 10.

In performing the substrate processing, a substrate processing recipe (also referred to as a "process recipe") corresponding to the substrate processing to be performed is loaded in, for example, the memory device 317 in the main controller 312. Then, if necessary, an operation instruction from the main controller 312 is transmitted to the components of the sub controller 314 such as the temperature controller 326, the gas controller 328, the pressure controller 330 and the transfer controller 350. The substrate processing performed in this way includes at least a loading step, a film-forming step and an unloading step. According to the present embodiment, the substrate processing further includes a transfer step (and a substrate loading step of transferring the plurality of the wafers including the wafer 200 to the substrate processing apparatus 100, which will be described later) and a collection step.

S101: Substrate Loading Step

When the main controller 312 receives a substrate loading instruction from an external management computer such as the computer 302, the main controller 312 starts a sequence of the substrate processing. Specifically, when the pod 110 is placed on the loading port 114 by an external transfer device, the main controller 312 issues a start instruction (loading instruction) of the substrate loading step of loading the pod 110 in the rotatable pod shelf 105 and transmits the start instruction to the transfer controller 350. Then, the transfer controller 350 controls the pod transfer device 118 to transfer the pod 110 between the loading port 114 and the rotatable pod shelf 105.

S102: Transfer Step

Next, the main controller 312 issues an instruction of driving the wafer transport mechanism 125 to the transfer controller 350. Then, the wafer transport mechanism 125 starts the transfer of the plurality of the wafers including the wafer 200 from the pod 110 placed on the placement table 122 to the boat 217 while following the instruction from the transfer controller 350. The transfer of the plurality of the wafers is performed until all the wafers scheduled to be loaded into the boat 217 is loaded into the boat 217 (that is, the wafer charging is completed).

S103: Loading Step

When a predetermined number of the wafers (that is, the plurality of the wafers including the wafer 200) is loaded into the boat 217, the boat 217 is elevated by the boat elevator 115 configured to operate according to the instruction from the transfer controller 350, and is loaded into the process chamber 201 provided in the process furnace 202 (boat loading). When the boat 217 is completely loaded into the process chamber 201, the seal cap 219 of the boat elevator 115 closes the lower end of the manifold of the process furnace 202 in airtight manner.

S104: Processing Step (Film-Forming Step)

Thereafter, a vacuum exhaust device (not shown) of the substrate processing apparatus 100 vacuum-exhausts the process chamber 201 according to an instruction from the pressure controller 330 such that the inner pressure of the process chamber 201 reaches a predetermined processing pressure (vacuum degree). In addition, the heater heats the process chamber 201 according to an instruction from the temperature controller 326 such that the inner temperature of the process chamber 201 reaches a predetermined processing temperature. Subsequently, the boat rotating mechanism 129 rotates the boat 217 and the plurality of the wafers including the wafer 200 according to an instruction from the transfer controller 350. While the inner pressure of the process chamber 201 is maintained at the predetermined processing pressure and the inner temperature of the process chamber 201 is maintained at the predetermined processing temperature, a predetermined gas such as a process gas is supplied to the plurality of the wafers including the wafer 200 accommodated in the boat 217 in order to perform a predetermined process (for example, the film-forming process) to the wafer 200.

S105: Unloading Step

After the film-forming step S104 to the wafer 200 placed on the boat 217 is completed, the boat rotating mechanism 129 stops the rotation of the boat 217 and the plurality of the wafers including the wafer 200 accommodated in the boat 217 according to an instruction from the transfer controller 350, and the seal cap 219 is lowered by the boat elevator 115 in order to open the lower end of the manifold. The boat 217 with the processed wafers including the wafer 200 accommodated therein are then transferred (unloaded) out of the process furnace 202 (boat unloading).

S106: Collection Step

Thereafter, the boat 217 with the processed wafers including the wafer 200 accommodated therein are very effectively cooled by the clean air 133 ejected from the clean air supply mechanism 134. For example, when the boat 217 is cooled to 150° C. or lower, the wafer detection described above is performed by the wafer abnormality detection device 400. That is, the wafer abnormality detection device 400 detects the abnormality of the processed wafers including the wafer 200. When no abnormality is detected, the processed wafers including the wafer 200 are transferred (discharged) from the boat 217 (wafer discharging). After the processed wafers including the wafer 200 are transferred to the pod 110, other unprocessed wafers may be transferred to the boat 217.

Figure 9:
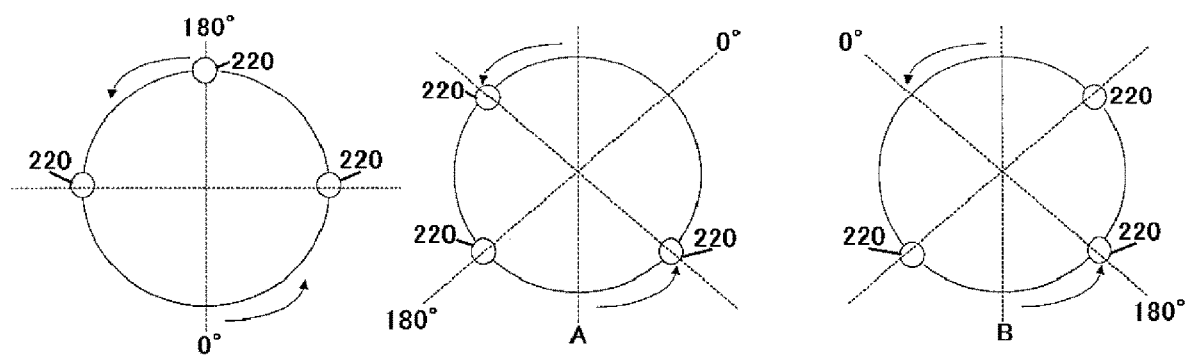
FIG. 9 schematically illustrates the wafer detection operation preferably used in the embodiments described herein.

As shown in FIG. 9, the wafer detection by the wafer abnormality detection device 400 according to the present embodiment is performed by rotating the boat 217 in a rotation direction (indicated by arrows in FIG. 9) of the boat 217 by a predetermined angle A (or a predetermined angle B) to a transferable position where the wafer 200 can be transferred to/from the boat 217 via a reference point (0°) such that the wafer 200 is moved to a crack detection position. Thereafter, the pair of the detection arms 401 provided at the wafer transport device 125a is slid into contact with the wafer 200 to be supported by the pair of the detection arms 401, and the measurement as shown in FIG. 8B is performed.

The data of the crack detection position in the rotation direction (also referred to as an "R-axis direction") of the boat 217 is acquired in advance as the master data. That is, both data when the wafer 200 is rotated by rotating the boat 217 to the position of the predetermined angle A and the predetermined angle B as the crack detection position are obtained. In addition, machine teaching is performed such that the sensor S1 provided on the pair of the detection arms 401 in the wafer transport device 125a can detect the wafer 200, and the data on the transferable position in which the wafer transport device 125a can transfer the wafer 200 is acquired as the master data. The master data is stored in the memory device 317.

As described above, the transfer controller 350 can rotate the boat 217 to the crack detection position using the boat rotating mechanism 129 with reference to the transferable position in which the wafer 200 can be transferred, and the abnormality determination part 351 can detect the wafer 200 at the position where the sensor S1 does not collide with the plurality of the support columns 220 between the plurality of the support columns 220 of the boat 217. Therefore, it is possible to perform the detection of the wafer 200 (for example, a placement state of the wafer 200) without contacting the wafer 200 even when the wafer 200 jumps out.

As a result of the wafer detection by the wafer abnormality detection device 400 according to the present embodiment, when the wafer 200 in which the abnormality occurs is detected, the abnormality determination part 351 is configured to control the transfer controller 350 such that the processed wafers including the wafer 200 are discharged from the boat 217 (wafer discharging) according to the content of the abnormality. Even when the abnormality such as the wafer jump-out has occurred, the abnormality determination part 351 can determines the location where the wafer 200 jumps out based on the measurement shown in FIG. 8B described above by reflecting the detection result of "no wafer" by the sensor S1.

According to the present embodiment, even when the abnormality has occurred in the wafer 200, the abnormality determination part 351 may cancel the wafer abnormality when the wafer 200 in which the abnormality occurs is removed or when the wafer 200 in which the abnormality occurs and the wafers above and below the wafer 200 are removed so that the cause of the abnormality is eliminated. Then, the transfer controller 350 controls the wafer transport mechanism 125 so as to collect other normal processed wafers among the processed wafers from the boat 217. Thereby, it is possible to reduce the damage to the normal processed wafers due to the abnormality (particularly, the wafer jump-out).

The normal processed wafers stored in the pod 110 from the boat 217 are temporarily stored in the rotatable pod shelf 105 from the placement table 122, and then collected outside the substrate processing apparatus 100. When all the normal processed wafers are transferred from the boat 217 to the pod 110, the main controller 312 is configured to terminate the sequence of the substrate processing. In addition, the collection step S106 may includes a step of transferring the normal processed wafers from the rotatable pod shelf 105 to the loading port 114 and a step of unloading the pod 110 used for the substrate processing from the loading port 114 to the outside of the substrate processing apparatus 100. Then the main controller 312 may terminate the sequence of the substrate processing.

First Modified Example

According to the first embodiment, the wafer detection by the wafer abnormality detection device 400 is performed by detecting the substrate (that is, the wafer 200) by rotating the boat 217 by the predetermined angle A (or the predetermined angle B). However, according to the wafer detection by the wafer abnormality detection device 400 of a first modified example of the first embodiment, the boat 217 is rotated by the predetermined angle A (or the predetermined angle B) to detect the wafer crack as in the first embodiment, and then the boat 217 is further moved (rotated) to the position of the predetermined angle B (by rotating by an angle obtained by subtracting the predetermined angle A from the predetermined angle B) to detect the wafer crack. According to the first modified example, the same effects of the first embodiment described above may be obtained. In addition, according to the first modified example, it is possible to detect microscopic change (for example, defects in a part of the wafer 200) that occurs in the wafer 200 than in the first embodiment.

Second Modified Example

Since the wafer detection by the wafer abnormality detection device 400 cannot be performed in a wafer transport position (that is, the transferable position in which the wafer 200 is transferred) when the wafer 200 jumps out, according to the first embodiment, the wafer detection is performed after the boat 217 is rotated by the predetermined angle A (or the predetermined angle B). As shown in FIG. 7, when the wafer 200 jumps out after the boat 217 is rotated by the predetermined angle A (or the predetermined angle B), the wafer detection cannot be performed. However, when no wafer among the processed wafers jumps out, it is possible to perform the wafer detection by the wafer abnormality detection device 400 in the wafer transport position.

Therefore, the wafer detection by the wafer abnormality detection device 400 according to the second modified example may be performed as described below. That is, the wafer crack is detected after the boat 217 is rotated by the predetermined angle A, and then the wafer crack is detected again after the boat 217 is further rotated reversely by the predetermined angle A (or rotated by an angle obtained by subtracting the predetermined angle A from 360°) to return to the wafer transport position. According to the second modified example, the same effects of the first embodiment described above may be obtained. In addition, according to the second modified example, it is possible to detect a microscopic change (for example, the defects in a part of the wafer 200) that occurs in the wafer 200 than in the first embodiment. In addition, since it is not necessary to return the boat 217 to a reference position (the left side of FIG. 9) after the wafer detection, it is possible to collect the processed wafers including the wafer 200 immediately when there is no abnormality.

Second Embodiment

The wafer detection by the wafer abnormality detection device 400 according to a second embodiment is performed after the transfer step S102 of the substrate processing and before the loading step S103 of the substrate processing. Thereby, it is possible to detect the abnormality of the wafer 200 before the wafer 200 is transferred (loaded) into the process furnace 202. As a result, a process of removing the wafer 200 that involves the abnormality, a process of exchanging the wafer 200 that involves the abnormality with a dummy wafer, or a process of loading the wafer 200 that involves the abnormality onto the plurality of the support columns 220 when the wafer 200 slightly jumps out may be performed.

As described above, according to the second embodiment, a recovery process such as the process of removing the wafer 200 that involves the abnormality may be performed according to the content of the detected abnormality before loading the boat 217 into the process furnace 202, and the other normal wafers are loaded in the boat 217 by the subsequent loading step may be performed. Therefore, it is possible to continue the substrate processing while reducing the influence of the wafer 200 that involves the abnormality.

The second embodiment may be combined with the first embodiment without hindering the first embodiment. In addition, the second embodiment may be combined with one of the first modified example and the second modified example. In addition, the second embodiment may be combined with at least one example selected from the first embodiment, the first modified example and the second modified example.

Third Embodiment

According to a third embodiment, a pitch of the tweezers 125c of the wafer transport device 125a is confirmed (checked) before performing the transfer step S102 or the collection step S106. When an abnormality of the tweezers 125c is detected by confirming the pitch, the transfer step S102 (that is, the wafer charging) or the collection step S106

(that is, the wafer discharging) cannot be performed until the abnormality of the tweezers 125c is resolved.

According to the third embodiment, it is possible to prevent the abnormality in the transfer of the plurality of the wafers including the wafer 200 (for example, the collision of the tweezers 125c with the wafer 200 and the falling-off of the wafer 200). As a result, it is possible to perform the substrate processing without stopping the transfer of the plurality of the wafers, and it is also possible to improve the operating rate of the substrate processing apparatus 100. The third embodiment may be combined with the first embodiment including the first modified example and the second modified example or the second embodiment without hindering the first embodiment or the second embodiment. By combining the third embodiment with the first embodiment or the second embodiment, the same effects of the first embodiment or the second embodiment may be obtained.

Fourth Embodiment

According to a fourth embodiment, during the transfer step S102 of the substrate processing, the wafer 200 placed on the tweezers 125c of the wafer transport device 125a is loaded into the slot (groove) of the boat 217, and the wafer transport device 125a is temporarily stopped at a predetermined distance. Then, it is confirmed whether or not the wafer 200 is placed on the tweezers 125c. After confirming that the wafer 200 is placed on the tweezers 125c, the wafer transport device 125a is moved to the original position.

According to the fourth embodiment, it is possible to prevent the transfer abnormality by confirming the presence or absence of a slide wafer (i.e., a wafer that has slid off from its normal position) in the tweezers 125c. For example, even when the slide wafer is on the tweezers 125c (even when the wafer 200 is placed on the tweezers 125c), the wafer transport device 125a is stopped without moving to the original position (the position at the start of transfer). Therefore, it is possible to prevent the falling-off of the wafer 200. In addition, it is possible to detect the slide wafer that may cause the wafer 200 to jump out or to be displaced even if the slide wafer does not fall off. In addition, when there is the slide wafer, it is possible to selectively perform an operation of loading the boat 217 again without moving the wafer transport device 125a to the original position.

As described above, according to the fourth embodiment, it is possible to prevent the transfer abnormality without requiring a component such as a sensor by stopping the wafer transport device 125a temporarily at a predetermined distance from the loading position different from a initial position (that is, the original position) after the wafer transport device 125a moves from the initial position to the loading position and loads the plurality of the wafers including the wafer 200 on the boat 217.

The fourth embodiment may be combined with the first embodiment including the first modified example and the second modified example, the second embodiment or the third embodiment without hindering the first embodiment, the second embodiment or the third embodiment. By combining the fourth embodiment with the first embodiment, the second embodiment or the third embodiment, the same effects of the first embodiment, the second embodiment or the third embodiment may be obtained.

Other Embodiments

While the technique is described in detail based on the above-described embodiments such as the first embodiment, the second embodiment and the third embodiment, the above-described technique is not limited thereto. The above-described technique may be modified in various ways without departing from the gist thereof.

For example, while the embodiments are described by way of an example in which the controller such as the PMC 310 is embodied by a dedicated computer system, the controller is not limited to the dedicated computer system. For example, the controller may be embodied by a general computer system. For example, the controller may be embodied by preparing an external memory device storing the above-described program and installing the program stored in the external memory device into the general computer system. For example, the external memory device may include a semiconductor memory such as a USB memory. However, the means for providing the program to the computer is not limited to the external memory device. The program may be supplied to the computer using communication means such as the Internet and a dedicated line without using the external memory device. The memory device 317 or the external memory device may be embodied by a non-transitory computer readable recording medium. Hereafter, the memory device 317 and the external memory device are collectively referred to as the "recording medium". In the present specification, the term "recording medium" may refer to only the memory device 317, only the external memory device or both of the memory device 317 and the external memory device.

For example, the above-described embodiments are described by way of an example in which the substrate processing apparatus 100 is configured as a semiconductor manufacturing apparatus for manufacturing a semiconductor device. However, the above-described technique is not limited thereto. The above-described technique may be applied to an LCD (Liquid Crystal Display) manufacturing apparatus for processing a glass substrate. In addition, the above-described technique may also be applied to other substrate processing apparatuses such as an exposure apparatus, a photolithography apparatus, a coating apparatus and a processing apparatus using plasma.

The above-described technique may be applied to a substrate processing apparatus provided with a substrate detection mechanism configured to detect a transfer state of the substrate.

According to some embodiments in the present disclosure, without modifying hardware of the configuration, it is possible to detect a state of the substrate without contacting the substrate with a mechanism configured to detect a state of the substrate.

What is claimed is:

1. A method of manufacturing a semiconductor device, comprising:
   (a) processing a substrate placed on a substrate retainer; and
   (b) detecting a state of abnormality of the substrate placed on the substrate retainer after the substrate retainer is rotated by a first angle with respect to a transferable position, wherein the substrate is transferable by a substrate transport device to/from the substrate retainer in the transferable position, wherein the state of abnormality comprises a state where the substrate jumps out from the substrate retainer toward the substrate transport device.

2. The method of claim 1, further comprising:
(c) loading the substrate retainer, where the substrate is placed, into a reaction chamber; and
(d) unloading the substrate retainer out of the reaction chamber after the substrate is processed.

3. The method of claim 2, wherein (b) is performed before (a) is performed.

4. The method of claim 3, further comprising:
(e) detecting the substrate placed on the substrate retainer while the substrate retainer is in the transferable position,
wherein (b) is performed before (e) is performed and after (c) is performed.

5. The method of claim 1, further comprising:
(e) detecting a crack of the substrate placed on the substrate retainer after the substrate retainer is further rotated by a second angle.

6. The method of claim 1, further comprising:
(f) detecting a crack of the substrate placed on the substrate retainer after the substrate retainer is further rotated reversely by the first angle.

7. The method of claim 1, further comprising:
(g) cooling a transfer chamber where the substrate retainer and the substrate placed on the substrate retainer are disposed,
wherein the substrate retainer is rotated by the first angle in (b) after (g) is performed.

8. The method of claim 7, wherein (b) is performed when a temperature of the substrate is equal to or lower than a predetermined temperature after (g) is performed.

9. The method of claim 1, further comprising:
(h) transferring the substrate to the substrate retainer,
wherein the substrate retainer is rotated by the first angle in (b) after (h) is performed and before (a) is performed.

10. The method of claim 1, further comprising:
(i) placing the substrate onto a substrate holder and transferring the substrate to the substrate retainer by the substrate holder,
wherein, when an abnormality of the substrate retainer occurs before (i) is performed, (i) is suspended until the abnormality is resolved.

11. The method of claim 10, further comprising:
(j) moving the substrate transport device provided with the substrate holder from an initial position to a loading position where the substrate is transferable between the substrate retainer and the substrate holder, and stopping the substrate transport device after being moved backward by a predetermined distance from the loading position.

12. A substrate processing apparatus comprising:
a rotating mechanism configured to rotate a substrate retainer capable of accommodating a substrate thereon;
an abnormality detection device configured to detect an abnormality state of the substrate placed on the substrate retainer;
a controller configured to be capable of controlling the rotating mechanism and the abnormality detection device to perform:
(a) processing the substrate placed on the substrate retainer; and
(b) detecting a state of abnormality of the substrate placed on the substrate retainer after the substrate retainer is rotated by a first angle with respect to a transferable position, wherein the substrate is transferable by a substrate transport device to/from the substrate retainer in the transferable position, wherein the state of abnormality comprises a state where the substrate jumps out from the substrate retainer toward the substrate transport device.

13. The substrate processing apparatus of claim 12, wherein the abnormality detection device comprises
a pair of sensors, and
wherein the abnormality detection device is further configured to detect a transfer state of the substrate by the pair of sensors based on a light shielding.

14. The substrate processing apparatus of claim 12, wherein the abnormality detection device comprises
a plurality of sensors, and
wherein at least one sensor among the plurality of sensors is configured to detect a presence or absence of the substrate, and at least another sensor among the plurality of sensors is configured to detect a jump-out of the substrate.

15. The substrate processing apparatus of claim 12, wherein the abnormality detection device is further configured to detect that the abnormality state is one of: a wafer jump-out, a wafer crack, a slot difference and an empty slot.

16. The substrate processing apparatus of claim 12, further comprising:
a substrate holder provided with a transport mechanism and configured to support the substrate; and
a plurality of support columns provided in the substrate holder,
wherein a sensor is provided in the abnormality detection device so as not to collide with the plurality of support columns and is configured to detect an abnormality state of the substrate placed on the substrate holder.

17. The substrate processing apparatus of claim 16, further comprising:
a wafer transport mechanism located at a center between the plurality of support columns.

18. The substrate processing apparatus of claim 12, wherein the controller is further configured to be capable of controlling the rotating mechanism and the abnormality detection device to perform: detecting a crack of the substrate placed on the substrate retainer after the substrate retainer is further rotated by a second angle.

19. The substrate processing apparatus of claim 12, wherein the controller is further configured to be capable of controlling the rotating mechanism and the abnormality detection device to perform: detecting a crack of the substrate placed on the substrate retainer after the substrate retainer is further rotated reversely by the first angle.

20. A method of processing a substrate, comprising:
detecting a state of abnormality of the substrate placed on a substrate retainer after the substrate retainer is rotated by a first angle with respect to a transferable position, wherein the substrate is transferable by a substrate transport device to/from the substrate retainer in the transferable position, wherein the state of abnormality comprises a state where the substrate jumps out from the substrate retainer toward the substrate transport device.

21. A non-transitory computer-readable storage medium storing a program executable by a computer for performing the method of claim 1.

22. The substrate processing apparatus of claim 12, further comprising:
a substrate holder provided with a transport mechanism and configured to support the substrate; and
a wafer transport mechanism configured to transfer the substrate holder and the substrate, wherein the wafer transport mechanism comprises the abnormality detection device.

* * * * *